United States Patent [19]
Patel et al.

[11] Patent Number: 5,854,761
[45] Date of Patent: Dec. 29, 1998

[54] CACHE MEMORY ARRAY WHICH STORES TWO-WAY SET ASSOCIATIVE DATA

[75] Inventors: Sanjay Patel, Santa Clara; Rajasekhar Cherabuddi, Sunnyvale; Ramesh Panwar; Adam R. Talcott, both of Santa Clara, all of Calif.

[73] Assignee: Sun Microsystems, Inc., Palo Alto, Calif.

[21] Appl. No.: 883,544

[22] Filed: Jun. 26, 1997

[51] Int. Cl.$^6$ .................................................. G11C 7/00
[52] U.S. Cl. ...................................... 365/49; 365/230.03
[58] Field of Search ................................. 365/49, 230.03; 711/128

[56] References Cited

U.S. PATENT DOCUMENTS

| | | | |
|---|---|---|---|
| 4,905,188 | 2/1990 | Chuang et al. | 364/900 |
| 5,182,802 | 1/1993 | Dillard | 365/49 |
| 5,390,139 | 2/1995 | Smith et al. | 365/49 |
| 5,475,825 | 12/1995 | Yonezawa et al. | 365/49 |
| 5,555,529 | 9/1996 | Hose, Jr. et al. | 365/49 |

*Primary Examiner*—Son T. Dinh
*Attorney, Agent, or Firm*—Jones & Volentine, L.L.P.

[57] ABSTRACT

A cache memory array stores two-way set associative data. An odd set data bank stores odd number sets of the two-way set associative data, where the two ways of each odd number set are aligned horizontally within the odd set data bank. An even set data bank stores even number sets of the two-way set associative data, where the two ways of each even number set are aligned horizontally within the even set data bank. Also, the odd set data bank is aligned horizontally with the even set data bank such that each odd number set is aligned horizontally with a next even number set. The horizontally aligned ways are interleaved for data path width reduction. Set and way selection circuits extract lines of data from the array. The array may be structurally implemented by single-ported RAM cells.

20 Claims, 8 Drawing Sheets

5,854,761

CACHE MEMORY ARRAY WHICH STORES TWO-WAY SET ASSOCIATIVE DATA

BACKGROUND OF THE INVENTION

1. Field of the Invention

The present invention generally relates to a cache of a super-scalar microprocessor, and more particularly, the present invention relates to a cache structure and mechanism for sustaining a high-fetch bandwidth across multiple cache lines in a wide issue processor.

2. Description of the Related Art

The current generation of superscalar microprocessors have a high instruction bandwidth which necessitates the spanning of adjacent lines of address space in the instruction cache ("i-cache" herein). Also, due to power and area restrictions, typically only single-ported RAM cell are considered in the implementation of the i-cache array structure. As discussed in more detail below, these factors contribute to what is referred to herein as a "line-crossing" event. Line crossing occurs if a cache access for a given set of instructions requires access to more than one line of the cache simultaneously.

FIG. 1 illustrates a two-way set associative cache structure typically employed as an i-cache interfacing with main memory in an 8-issue superscalar machine. (Although not shown, an external cache may be interposed between the i-cache and main memory.) The i-cache is identified by reference numeral 102 and the main memory by reference numeral 104. The main memory 104 is divided into multiple groups (512 in this example) of eight-instruction (8i) lines, or 32-byte blocks. The numbers in parentheses denote the line or block number, whereby line (1) follows line (0), line (2) follows line (1), and so on. The memory 104 is depicted as byte aligned to relate it to cache-line sizes. Any two lines of each group of the main memory 104 may be stored in an associated set of the i-cache 102. In other words, any two lines of group 0 of main memory 104 can be stored in set 0 of i-cache 102, any two lines of group I of main memory 104 can be stored in set 1 of i-cache 102, and so on. The two instruction lines of each set of the i-cache 102 are stored in the two "ways" of the set, i.e., "way 0" and "way 1". The i-cache is capable of outputting one line (or one way) of instructions at a time.

Reference is now made to FIG. 2 for an explanation of a line crossing event in the i-cache of FIG. 1. A line crossing event is caused by a branch instruction in the executing program. Consider, for example, the case of sixteen instructions 0–15 stored in order in consecutive lines 202 and 204 of main memory 206. Reference character B1 denotes a branch "in" to instruction 3, and reference character B2 denotes a branch "out" at instruction 10. Thus, eight lines of programming are to be executed in the span of these two branches B1 and B2. However, notwithstanding the capability of the i-cache 102 to output 8 lines of data at a time, two cache access cycles are needed in this example. That is, a first cycle is needed to source five instructions, and a second cycle is needed to source three instructions. As shown in FIG. 2, way 0 of set 0 contains instructions 3–7, and way 0 of set 1 contains instructions 8–10. Keeping in mind that a single line or way is output at a time from the i-cache, a line crossing event occurs in which a cache access for a set of 8 instructions (or eight 32 bit words) requires accessing more than one 32-byte line of the cache. Since, in the example of an 8-issue machine, the processor pipeline is capable of processing eight instructions, line crossing creates inefficiencies in program execution.

In the absence of branch instructions, the program code would simply execute in order from one instruction to the next as stored in the i-cache, and there would rarely be a need to access the middle of a cache line. In fact, however, branch instructions are quite common. Moreover, line-crossing is an event that can be expected to occur at even higher frequencies given the large instruction bandwidth requirements of next-generation microprocessors. It is anticipated that 1 branch per set of instructions fetched per cycle will be encountered on average. The occurrence of a branch would lead to a line crossing event unless the branch address is aligned to an 8-word (32 byte) boundary in the main memory. In addition, once a branch causes a line crossing event, line crossing may continue to occur until there is a branch out of the address space. Line crossing events, requiring multiple cache accesses, thus have the potential to substantially slow processing speeds.

SUMMARY OF THE INVENTION

It is therefore an object of the present invention to overcome one or more drawbacks associated with the conventional i-cache architecture discussed above.

It is a further object of the present invention to provide a structure and mechanism for sustaining high-fetch bandwidth across multiple cache lines in a wide issue machine.

It is yet another object of the invention to provide a cache structure which allows for the accessing of multiple data spanning two cache lines in a single access cycle.

To achieve the above and other objects, the present invention provides a cache memory array for storing two-way set associative data, including an odd set data bank which stores odd number sets of the two-way set associative data, and an even set data bank which stores even number sets of the two-way set associative data. Conceptually, the two ways of each odd number set are aligned horizontally within the odd set data bank, and the two ways of each even number set are aligned horizontally within the even set data bank. Also, the odd set data bank is aligned horizontally with the even set data bank such that each odd number set is with its way components aligned horizontally with the corresponding next even number set. In the corresponding physical implementation, the 4 ways of the horizontally aligned sets are bit-interleaved.

In one aspect of the invention, the two-way set associative data contains x sets, and each of the odd and even set data banks have a data line height of x/2 lines. In one example, x equals 512.

In another aspect of the invention, each way is for storing y words, and a combined data width of the horizontally aligned data banks is 4y words. In one example, y equals 8, and each word is 32 bits.

In yet another aspect of the invention, the odd and even set banks are implemented by single-ported RAM cells.

To also achieve the above and other objects, the present invention provides a cache memory for storing and accessing two-way set associative data, including a memory array including an odd set data bank which stores odd number sets of the two-way set associative data, and an even set data bank which stores even number sets of the two-way set associative data, where the two ways of each odd number set are aligned horizontally within the odd set data bank and the two ways of each even number set are aligned horizontally within the even set data bank, wherein the horizontally aligned ways are interleaved for data path width reduction; a set selection circuit for selecting data from any one of the odd and even sets of the memory array; a way selection circuit for selecting data from any one of the two ways of each set selected by the set selection circuit; and a formatting circuit for rearranging an order of the data selected by the way selection circuit. Again, the memory array may be implemented by single-ported RAM cells.

BRIEF DESCRIPTION OF THE DRAWINGS

The above and other features and advantages of the present invention will become readily apparent from the description that follows, with reference to the accompanying drawings, in which.

DETAILED DESCRIPTION OF THE PREFERRED EMBODIMENTS

As already mentioned, a line crossing event occurs if a cache access for a set of 8 instructions (or 32-bit words) requires accessing more than one 32 byte line of the cache at the same time. Note that if the current access is to a line in one particular set, then line crossing requires that we also access a set which is incremented by 1 over the first set. The cache may thus be thought of in terms of odd and even sets. If an initial access is to an odd set, line crossing requires access also be made to an even set, and visa versa.

Figure 1:
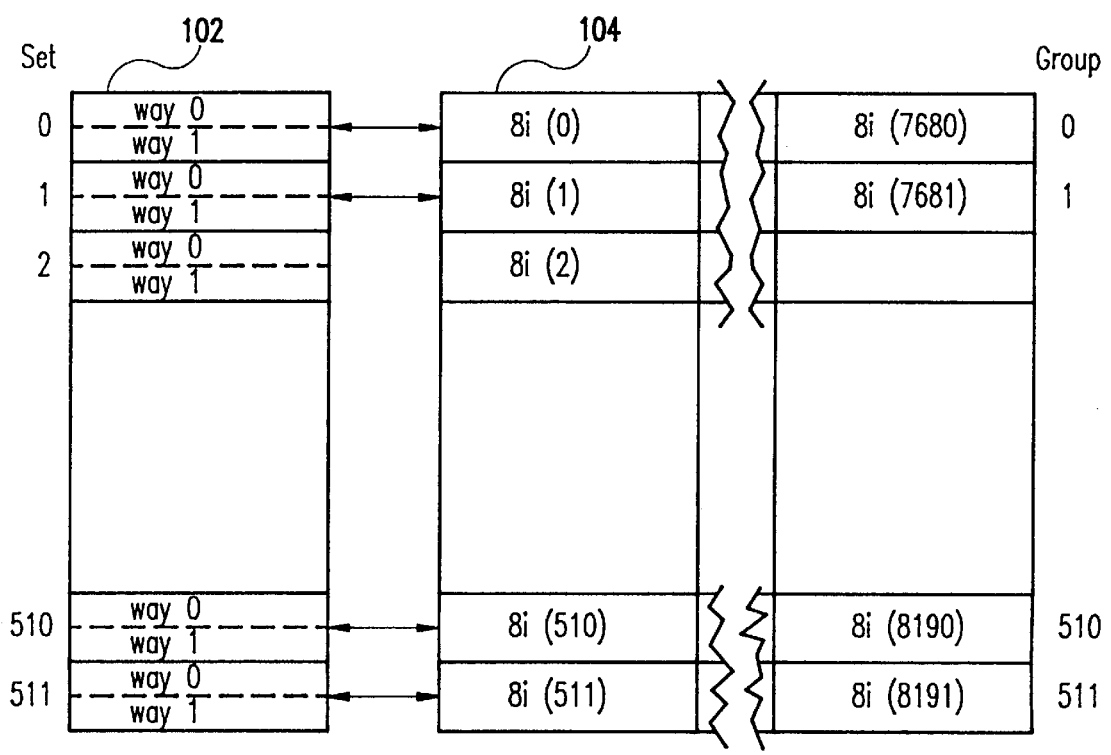
FIG. 1 illustrates a two-way set associative cache structure typically employed as an i-cache interfacing with main memory or lower levels of the on-chip memory hierarchy.
Figure 2:
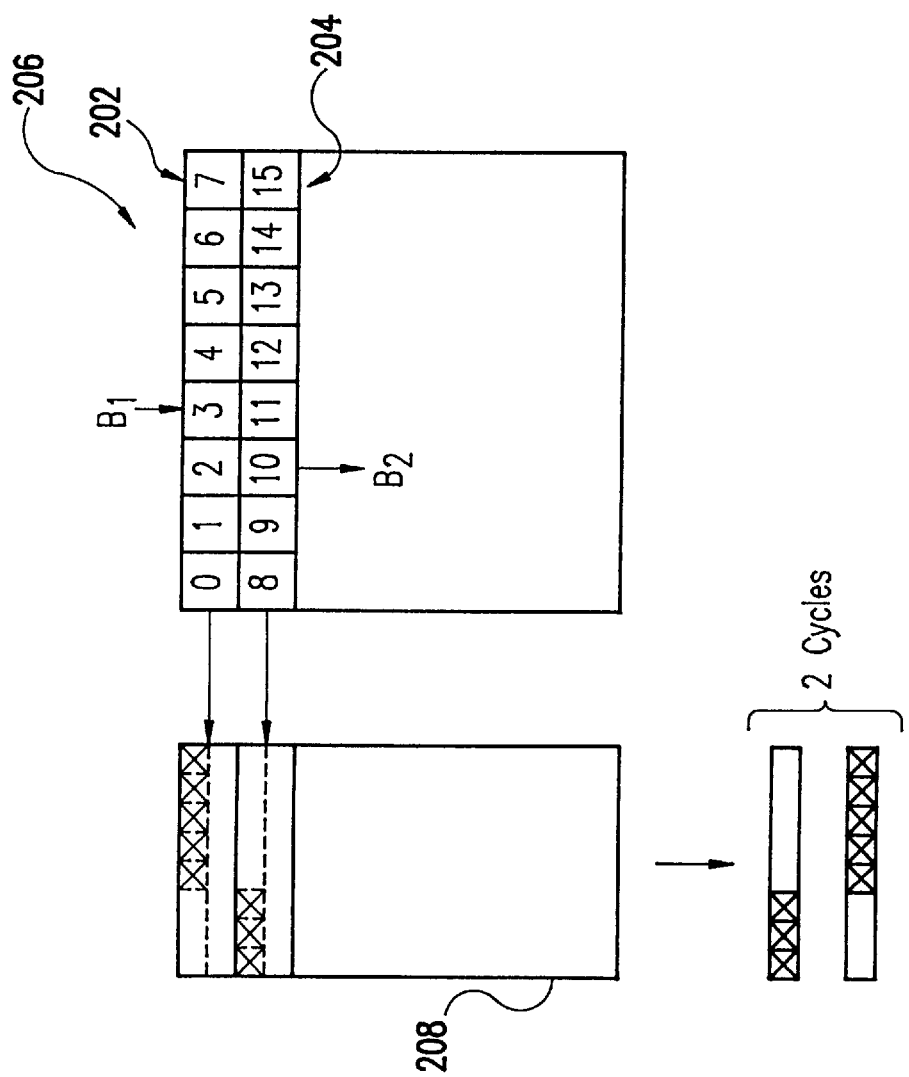
FIG. 2 is a diagram for explaining a line crossing event which occurs in the cache structure of FIG. 1.
Figure 3:
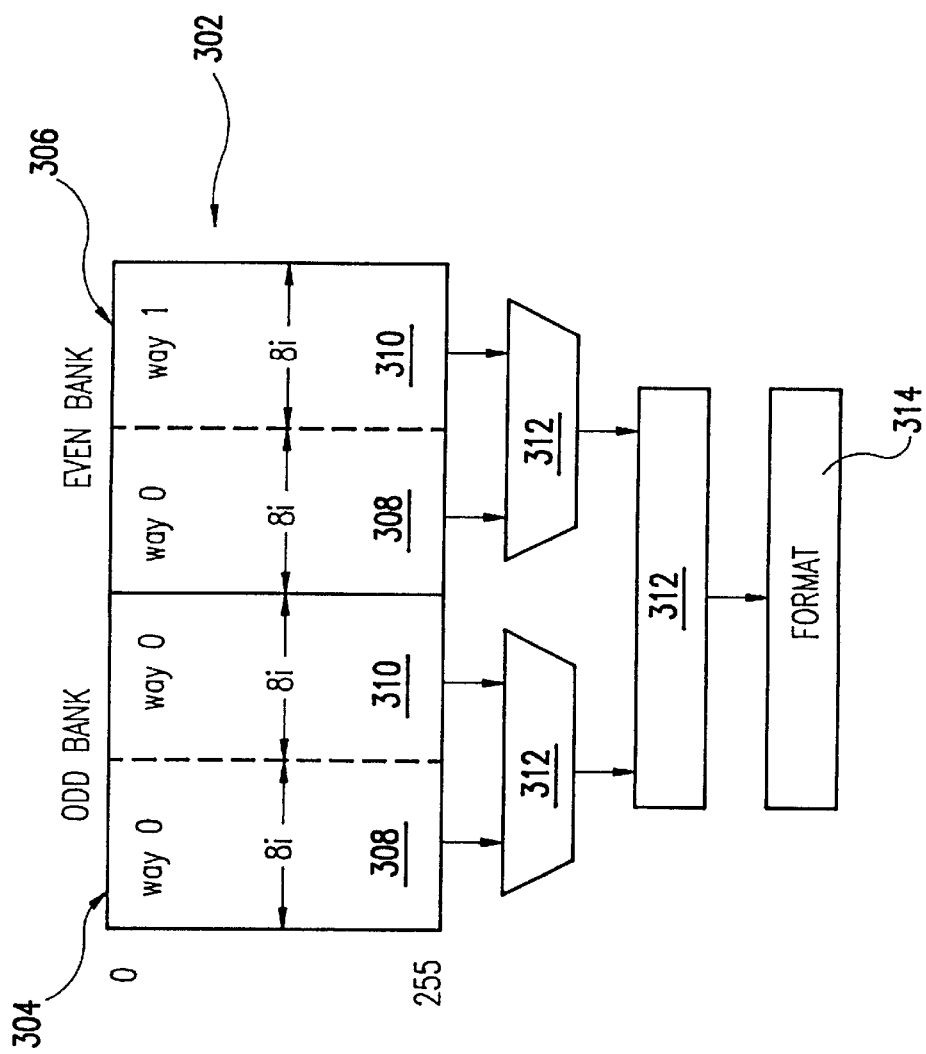
FIG. 3 is a diagram illustrating an example of an i-cache structure according to the present invention.
Figure 4:
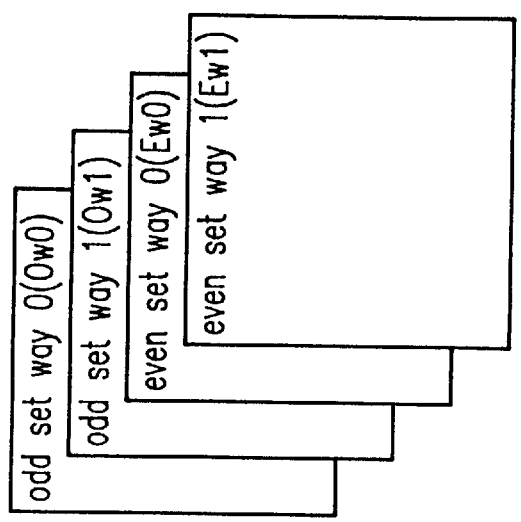
FIG. 4 is a diagram illustrating the interleaving of i-cache banks according to the present invention.

Reference is now made to FIG. 3 which illustrates an example of an i-cache structure according to the present invention. The i-cache 302 is comprised of two banks. One bank 304 contains all odd sets, and the other bank 306 contains all even sets. Each bank also provides two ways (or cache lines) 308 and 310 associated with a set. In the embodiment, the height of each bank is 256 sets (compared to 512 for FIG. 1), but the width has doubled to 16 instructions. That is, each way of each bank is 8 instructions wide, or 32 bytes wide. It is noted, however, that the present topology halves the height of the standard cache structure, thus significantly reducing the parasitics associated with bit lines and consequently reduces parasitic induced delays. As depicted in FIG. 4, the odd and even set ways 0 and 1 may be interleaved such that corresponding bits or words are horizontally aligned. In a physical implementation, however, the 4 bits that are interleaved need not be horizontally aligned. Rather, they may be arranged in a localized area to provide optimal area or delay characteristics.

Figure 5:
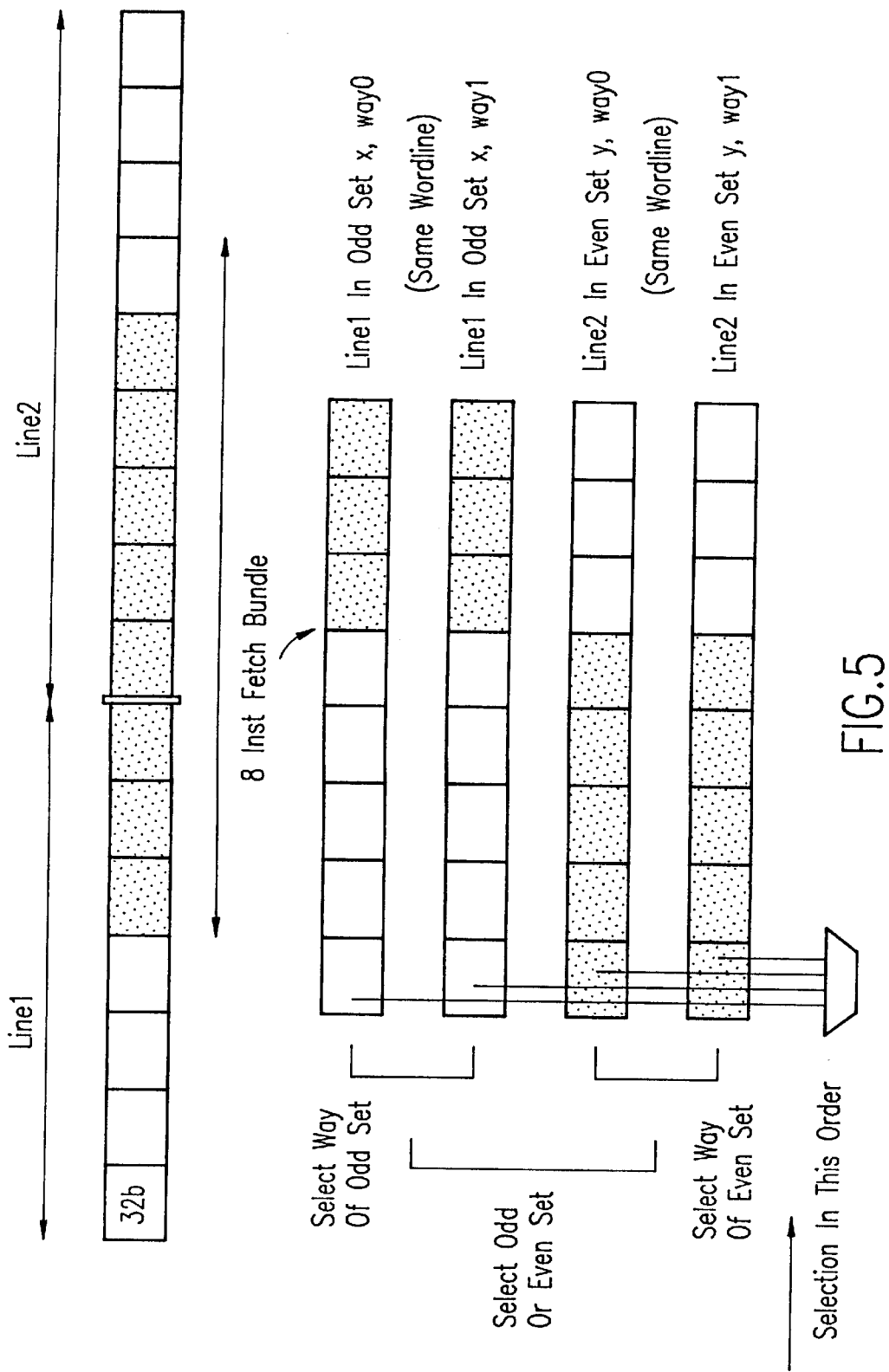
FIG. 5 is a diagram for explaining odd and even set selection, and way selection, among the cache lines of the i-cache banks according to the present invention.

As shown in FIG. 3, the way 0 and the way 1 of each of the odd and even banks of the cache 302 respectively output 4 lines of instructions. These 4 lines of instructions are transformed by way selection circuitry 312 and formatting circuitry 314 into the desired set of 8 instructions. This is conceptually illustrated in FIG. 5. Consider the example shown where an 8 instruction bundle to be fetched spans two lines. As determined by addresses, the last three instructions of line I are found in the last three word slots of either way 0 or way 1 of an odd set x, whereas the first five instructions of line 2 are found in the first five word slots of either way 0 or way 1 of even set y. For each word slot position, first an odd or even set is selected, then way 0 or way 1 is selected. There are four bit lines per bit of output in this case. It is noted that while the bits are shown as being vertically aligned in FIG. 5, they are actually horizontally aligned as suggested above.

Figure 6:
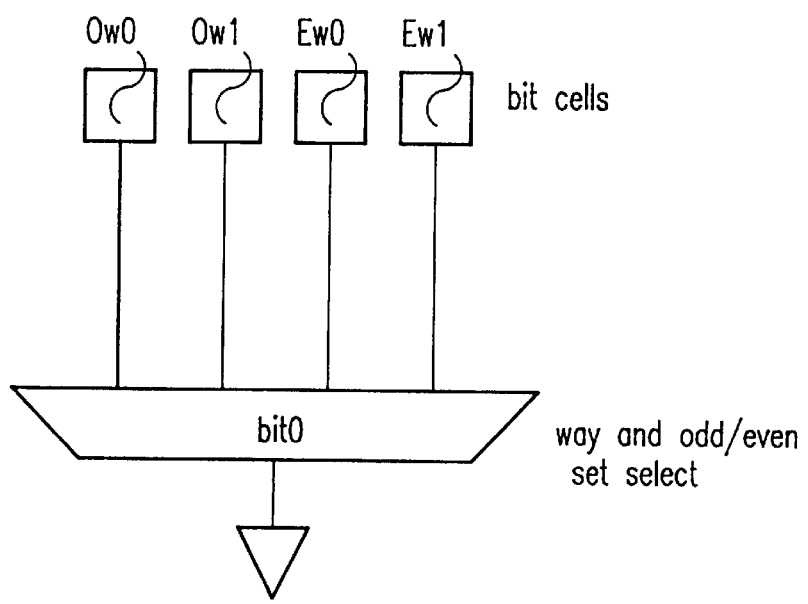
FIG. 6 illustrates a simplified structure for obtaining bit slices of an interleaved array according to the present invention.

In the exemplary embodiment herein, there are eight instructions in a line, and 4 bytes or 32 bits per instruction. Thus, for the interleaved banks in which the ways of odd and even sets are aligned horizontally, there are 8×32×4 bit cells in each combined row of the two banks. Also, as already mentioned, there are 256 rows per bank. FIG. 6 shows a simplified structure in which bit cells Ow0 (odd set, way 0), Ow1 (odd set, way 1), Ew0 (even set, way 0) and Ew1 (even set, way 1) are applied to way and odd/even select circuit to obtain a 1-bit output for each 4-bit input.

Figure 8:
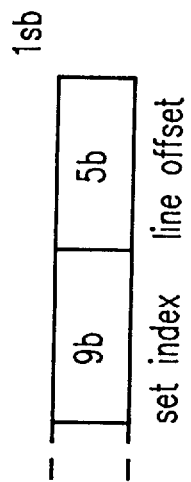
FIG. 8 is a bit diagram of a parsed virtual address of an instruction related to indexing into the array.
Figures 7A, 7B:
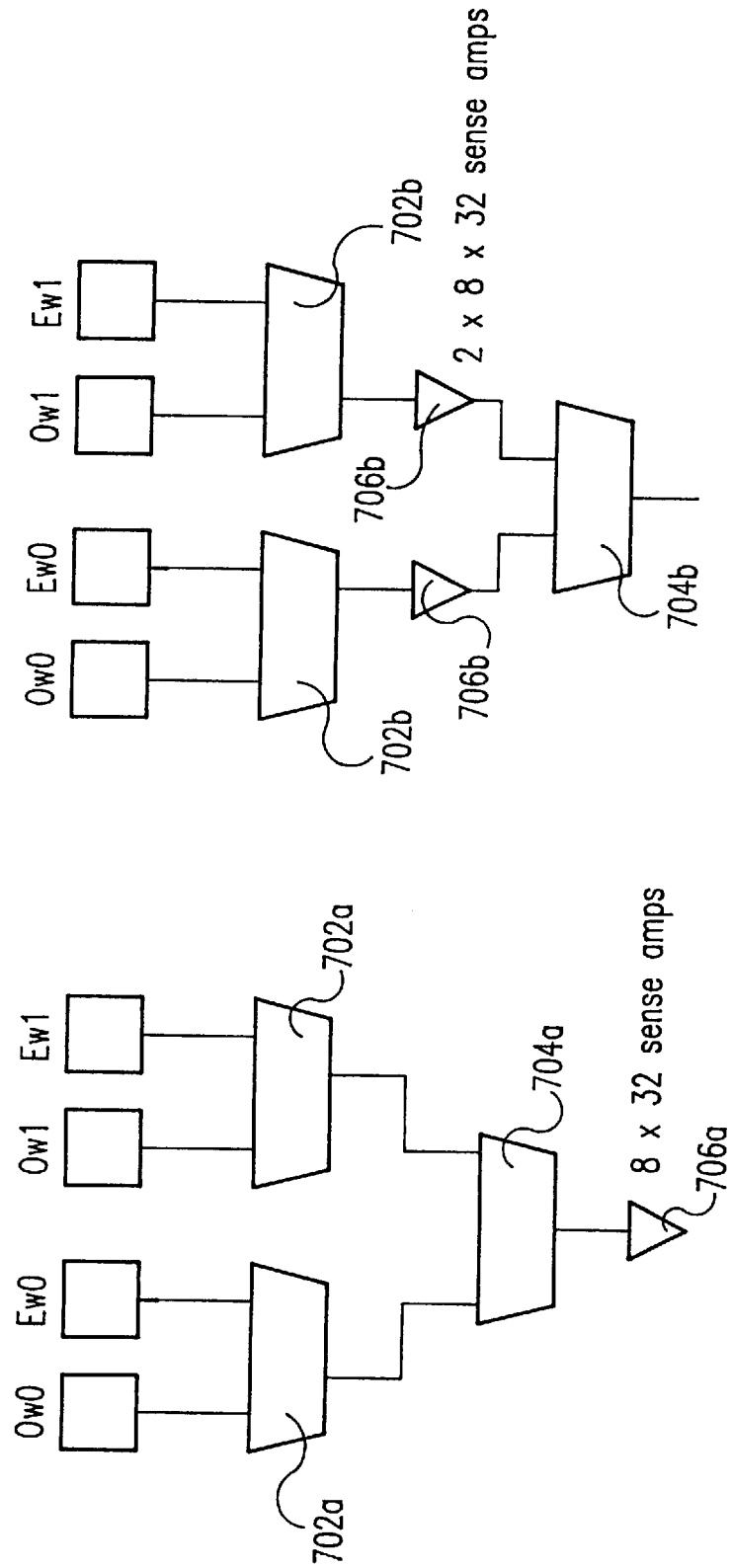
FIGS. 7(a) and 7(b) illustrate more complex structures for obtaining bit slices of the interleaved array according to the present invention.

FIGS. 7(a) and 7(b) illustrate more complex structures which take advantage of the fact that the ways of each set are mutually exclusive on a per instruction basis. As shown in FIG. 7 (a), the bit cells Ow0 and Ew0 are applied to a first odd/even select circuit (mux) 702a, whereas the bit cells Ow1 and Ew1 are applied to a second odd/even select circuit (mux) 704a. For each instruction (32 bits), the two circuits 702a select the same one of the odd or even sets based on the least significant bit (lsb) of the set index of the virtual address of the instruction under consideration. In the embodiment, the index to the cache is 14 bits. That is, as shown in the parsed virtual address of FIG. 8, the first five bits of the instruction address are a line offset which determines a byte offset into the 32 byte line of the cache. The next nine bits constitute a set index into the cache. The lsb of the set index defines whether the set of the instruction is an odd set or an even set in the embodiment of the invention.

The select circuits 702a in FIG. 7(a) output, for each instruction, either (Ow0 and Ow1) or (Ew0 and Ew1). Then, a way select circuit (mux) 704a selects, for all instructions, either way 0 or way 1. The way selection is based on conventional way-prediction or tag comparison techniques, and thus occurs later than the odd/even select which is based on the virtual address. The output of the way select circuit 704a is then amplified by a sense amplifier 706a to obtain the output instruction bits.

The structure of FIG. 7(b) is similar to that of FIG. 7(a), except that the sense amps 706b are applied to the output of the odd/even select circuits, rather than to the output of the way select circuit 704b. This has the effect of increasing speed, but requires additional sense amps and thus more power. That is, in the structure of FIG. 7(a), there is sensing of one line of data, or 8×32 bits, and thus 256 sense amps are supplied. On the other hand, in the structure of FIG. 7(b), there is sensing of two lines of data, or 8×2×32 bits, and 512 sense amps are needed. It is noted that this method could be extended to the differential bit lines of a sense amp. In the case of FIG. 7(a), 256 sense amps would still be used, and in the case of FIG. 7(b), 512 sense amps would be used.

Figure 9:
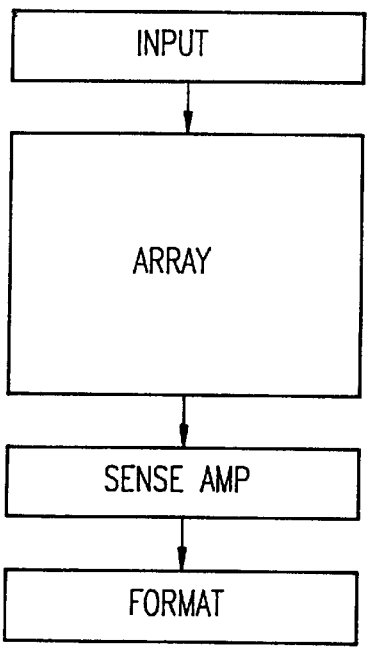
FIG. 9 is a diagram illustrating a top-level structure of the i-cache of the invention.
Figure 10:
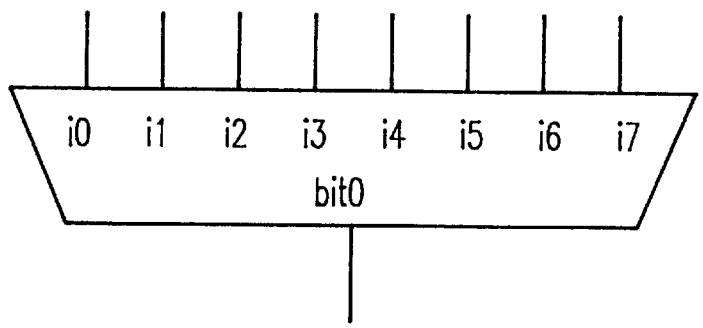
FIG. 10 is a diagram of a formatter associated with a bit-line slice according to the present invention.

FIG. 9 is a diagram illustrating a top-level structure of the i-cache of the invention. Address data are applied at input 902 to a cache array 904. The data are sensed by sense amps 906, and formatted by a formatter 908, to obtain a single line of eight instructions in a single fetch cycle. The formatter 908 is shown in FIG. 10, and function to rearrange the incoming bits so as to place the instructions in the proper order. Returning to the example of FIG. 5, the fifth instruction of the output line of instructions should actually be the first instruction of the final instruction line. The selected instructions are rearranged to preserve the order of the instructions contained in the original 8-instruction fetch bundle.

Figure 11:
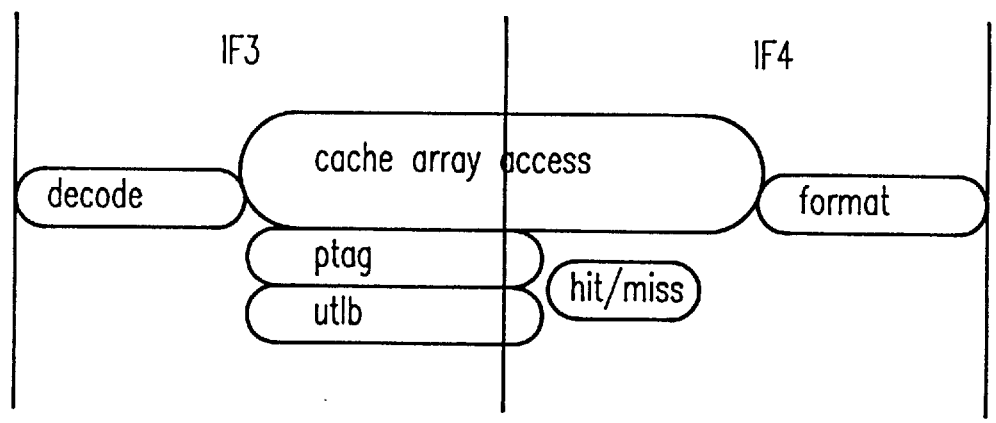
FIG. 11 is a flow diagram of a cache access according to the present invention.

FIG. 11 shows a flow diagram of the cache access according to the invention. In a IF3, the instruction address is decoded, and access to the cache array begins. This includes the odd/even selection discussed above. In IF4, tag comparison or way selection occurs, and then formatting, to simultaneously generate the desired line of instructions which otherwise spans two lines in the cache memory.

The invention can be extended to any such memory array structure regardless of the memory size or set structure. Further, it is noted that the present invention has multiple applications. For example, the invention can be applied as a cache for sourcing instructions to the pipeline. It may also be applied to the array structure that sources next-instruction-fetch addresses which ultimately may serve as an index to the above-described cache.

The present invention has been described by way of a specific exemplary embodiment, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A cache memory array for storing two-way set associative data having odd and even number sets of data and two ways of data per set, said cache memory array comprising:

an odd set data bank which stores odd number sets of the two-way set associative data, wherein the two ways of each odd number set are aligned horizontally within said odd set data bank; and, an even set data bank which stores even number sets of the two-way set associative data, wherein the two ways of each even number set are aligned horizontally within said even set data bank.

2. A cache memory array as claimed in claim 1, wherein said odd set data bank is aligned horizontally with said even set data bank such that each odd number set is aligned horizontally with a next or previous even number set.

3. A cache memory array as claimed in claim 1, wherein the two-way set associative data contains x sets, and wherein each of the odd and even set data banks have a data height of x/2 lines.

4. A cache memory array as claimed in claim 2, wherein the two-way set associative data contains x sets, and wherein each of the odd and even set data banks have a data height of x/2 lines.

5. A cache memory array as claimed in claim 1, wherein each way is for storing y words, and wherein a data word width of each of said odd and even set data banks is 2y words.

6. A cache memory array as claimed in claim 4, wherein each way is for storing y words, and wherein a combined data width of said horizontally aligned data banks is 4y words.

7. A cache memory array as claimed in claim 1, wherein the horizontally aligned way of each set are bit-interleaved.

8. A cache memory array as claimed in claim 2, wherein the horizontally aligned way of each set are bit-interleaved.

9. A cache memory array as claimed in claim 6, wherein x equals 512 and y equals 8.

10. A cache memory array as claimed in claim 7, wherein each word consists of 32 bits.

11. A cache memory array as claimed in claim 1, wherein said odd and even set banks are implemented by single-ported RAM cells.

12. A cache memory array as claimed in claim 4, wherein said odd and even set banks are implemented by single-ported RAM cells.

13. A cache memory array as claimed in claim 8, wherein said odd and even set banks are implemented by single-ported RAM cells.

14. A cache memory for storing and accessing two-way set associative data having odd and even number sets of data and two ways of data per set, said cache memory comprising:

a memory array including an odd set data bank which stores odd number sets of the two-way set associative data, and an even set data bank which stores even number sets of the two-way set associative data, wherein the two ways of each odd number set are aligned horizontally within said odd set data bank, and wherein the two ways of each even number set are aligned horizontally within said even set data bank, wherein the horizontally aligned ways are interleaved for datapath width reduction;

a set selection circuit for selecting data from any one of odd and even sets of said memory array;

a way selection circuit for selecting data from any one of the two ways of each set selected by said set selection circuit; and, a formatting circuit for rearranging an order of the data selected by said way selection circuit.

15. A cache memory array as claimed in claim 14, wherein said odd set data bank is aligned horizontally with said even set data bank such that each odd number set is aligned horizontally with a next or previous even number set.

16. A cache memory array as claimed in claim 14, wherein the two-way set associative data contains x sets, and wherein each of the odd and even set data banks have a data line height of x/2 lines.

17. A cache memory array as claimed in claim 15, wherein the two-way set associative data contains x sets, and wherein each of the odd and even set data banks have a data line height of x/2 lines.

18. A cache memory array as claimed in claim 14, wherein each way is for storing y words, and wherein a data width of each of said odd and even set data banks is 2y words.

19. A cache memory array as claimed in claim 17, wherein each way is for storing y words, and wherein a combined data width of said horizontally aligned data banks is 4y words.

20. A cache memory array as claimed in claim 14, wherein said memory array is implemented by single-ported RAM cells.

* * * * *